(12) United States Patent
Cho

(10) Patent No.: US 7,633,423 B2
(45) Date of Patent: Dec. 15, 2009

(54) METHOD OF AND APPARATUS FOR REDUCING SETTLING TIME OF A SWITCHED CAPACITOR AMPLIFIER

(75) Inventor: Taehee Cho, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/934,195

(22) Filed: Nov. 2, 2007

(65) Prior Publication Data
US 2009/0115507 A1 May 7, 2009

(51) Int. Cl.
*H03M 1/38* (2006.01)
(52) U.S. Cl. .................................. 341/161; 341/155
(58) Field of Classification Search ................ 341/161, 341/156, 118, 120, 172, 155
See application file for complete search history.

(56) References Cited

U.S. PATENT DOCUMENTS

| 5,631,853 | A | * | 5/1997 | Miller et al. | ............... 702/176 |
| 5,892,473 | A | | 4/1999 | Shin | |
| 6,509,790 | B1 | | 1/2003 | Yang | |
| 7,265,703 | B2 | * | 9/2007 | Sasaki et al. | ............... 341/161 |
| 2003/0020530 | A1 | | 1/2003 | Lee et al. | |
| 2004/0008133 | A1 | | 1/2004 | Manganaro | |
| 2004/0070917 | A1 | | 4/2004 | Michalski | |
| 2005/0073351 | A1 | | 4/2005 | Ko et al. | |
| 2005/0073452 | A1 | | 4/2005 | Manganaro | |
| 2005/0134368 | A1 | | 6/2005 | Chandrasekaran | |
| 2005/0270210 | A1 | | 12/2005 | Arslan | |
| 2006/0119412 | A1 | | 6/2006 | Wei | |
| 2006/0255780 | A1 | | 11/2006 | Sihvola | |
| 2006/0290406 | A1 | | 12/2006 | Yeh | |
| 2007/0030059 | A1 | | 2/2007 | Forbes et al. | |
| 2007/0035434 | A1 | | 2/2007 | Tachibana et al. | |

FOREIGN PATENT DOCUMENTS

JP          2006295593      10/2006
WO     WO 2007/005407 A2    1/2007

OTHER PUBLICATIONS

B. R. Schiffer et al., "An Active Charge Cancellation System for Switched-Capacitor Sensor Interface Circuits", IEEE Journal, vol. 33, No. 12, Dec. 1998, pp. 2134-.
L. Dai et al., "CMOS Switched-Op-Amp-Based Sample-and-Hold Circuit", IEEE Journal, vol. 35, No. 1, Jan. 2000, pp. 109-.
R. C. Yen et al., "A MOS Switched-Capacitor Instrumentation Amplifier", IEEE Journal, vol. SC-17, No. 6, Dec. 1982, pp. 1008-.
Y. Fujimoto et al., "A Low-Power Switched-Capacitor Variable Gain Amplifier", IEEE Journal, vol. 39, No. 7, Jul. 2004, pp. 1213-.

* cited by examiner

*Primary Examiner*—Rexford N Barnie
*Assistant Examiner*—Joseph Lauture
(74) *Attorney, Agent, or Firm*—Ratner Prestia

(57) ABSTRACT

A method and apparatus for reducing settling time of a switched capacitor amplifier. The method includes disconnecting first and second capacitors from an amplifier. When the first and second capacitors are disconnected from the amplifier, they are charged by respective first and second input signals. The apparatus includes a plurality of sampling capacitors, each configured to sample a respective one of a plurality of signals during a sampling phase, an amplifier, and a plurality of decoupling switches configured to isolate the sampling capacitors from the amplifier during the sampling phase and to connect the plurality of sampling capacitors to the amplifier during the amplifying phase.

23 Claims, 6 Drawing Sheets

US 7,633,423 B2

METHOD OF AND APPARATUS FOR REDUCING SETTLING TIME OF A SWITCHED CAPACITOR AMPLIFIER

BACKGROUND OF THE INVENTION

In general, the present invention relates to CMOS circuitry and, more particularly, to switched capacitor amplifiers.

Analog integrated circuits (ICs) are integrated circuits that process analog signals. Examples of such circuits may include, for example, amplifiers, reference current sources, and reference voltage sources. Digital integrated circuits are ICs which process digital signals. Examples of digital integrated circuits may include, for example, logical circuit and state machines, such as processors.

Some integrated circuits, however, may process both analog and digital signals. Such circuits are known as mixed signal integrated circuits. Mixed signal ICs may require the use of a DC bias current supply. A common example of a mixed signal circuit is an analog-to-digital converter (ADC). ADCs, such as pipelined ADCs, may accept an input analog signal and produce an output digital signal having a value corresponding to the magnitude of the input analog signal. ADCs may be found in numerous products, such as CMOS based imaging products. CMOS imaging products may include ICs that include a plurality of ADCs, so that a plurality of analog signals may be simultaneously converted to corresponding digital signals.

Most CMOS imagers have a maximum power consumption value, which they may not exceed. The ADCs' constant consumption of current from the DC bias current supply forms a significant part of the maximum power consumption value for most imagers. Accordingly, it is desirable to reduce imager power consumption attributable to sources other than consumption of the DC bias current.

One such source of power consumption by the ADCs themselves is the switched capacitor amplifiers that make up the various stages of pipelined ADCs. Switched capacitor amplifiers may include a number of switches. Charge injection from turning on or off at least some of the switches contributes to a relatively long settling time of the switched capacitor amplifier, which increases ADC power consumption.

DETAILED DESCRIPTION OF THE INVENTION

Figure 5:
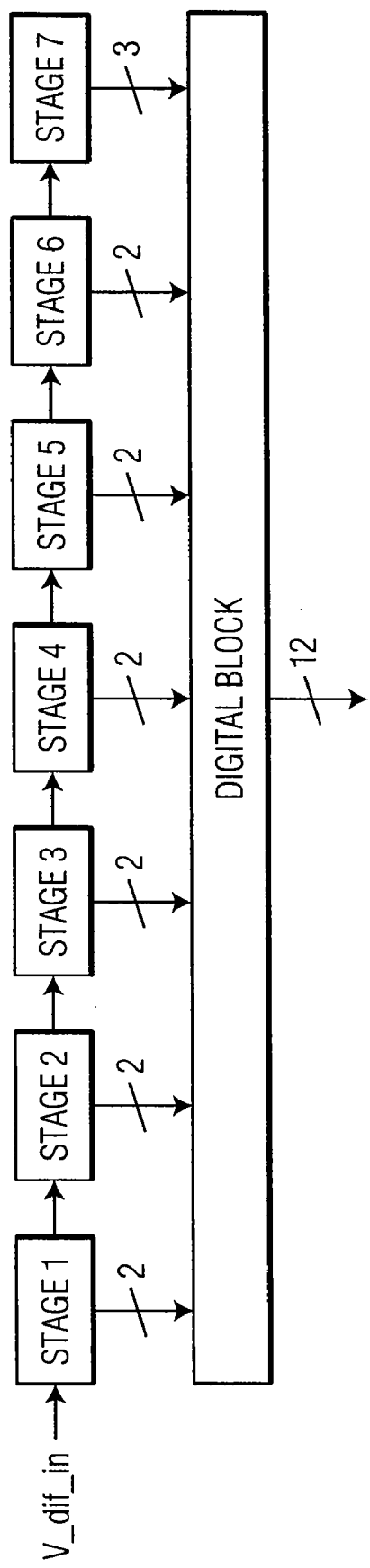
FIG. 5 is a diagram of a 1.5 bit per stage pipelined ADC which may be used with the switched capacitor amplifier of FIGS. 2(a)-(d).

An example 1.5 bit per stage pipelined ADC for converting an analog signal into digital words is shown in FIG. 5. As shown, the example ADC may include 7 cascade connected stages. Each of the first six stages may convert a portion of the analog signal using two lines to encode three values (i.e. 1.5 bits). Stage seven may convert the remaining portion of the analog signal into three digital bits, resulting in a total conversion of the analog signal into a twelve bit digital word.

Each stage may include at least one switched capacitor amplifier. Stage 1 may receive a differential input signal v_dif in and timing and reference signals (not shown). Stages 2-7 may receive the timing and reference signals and receive an output signal from the preceding stage. The output signal from each stage may equal the input signal to the stage, less the value of the portion of the signal already converted, amplified by a predetermined gain factor. For stage 1, the predetermined gain factor may be, for example, 1 and for stages 2-7, the predetermined gain factor may be, for example, 2.

Each stage may provide signals to the digital block (encoder), as shown. The digital block may output a 12 bit word.

Figure 6:
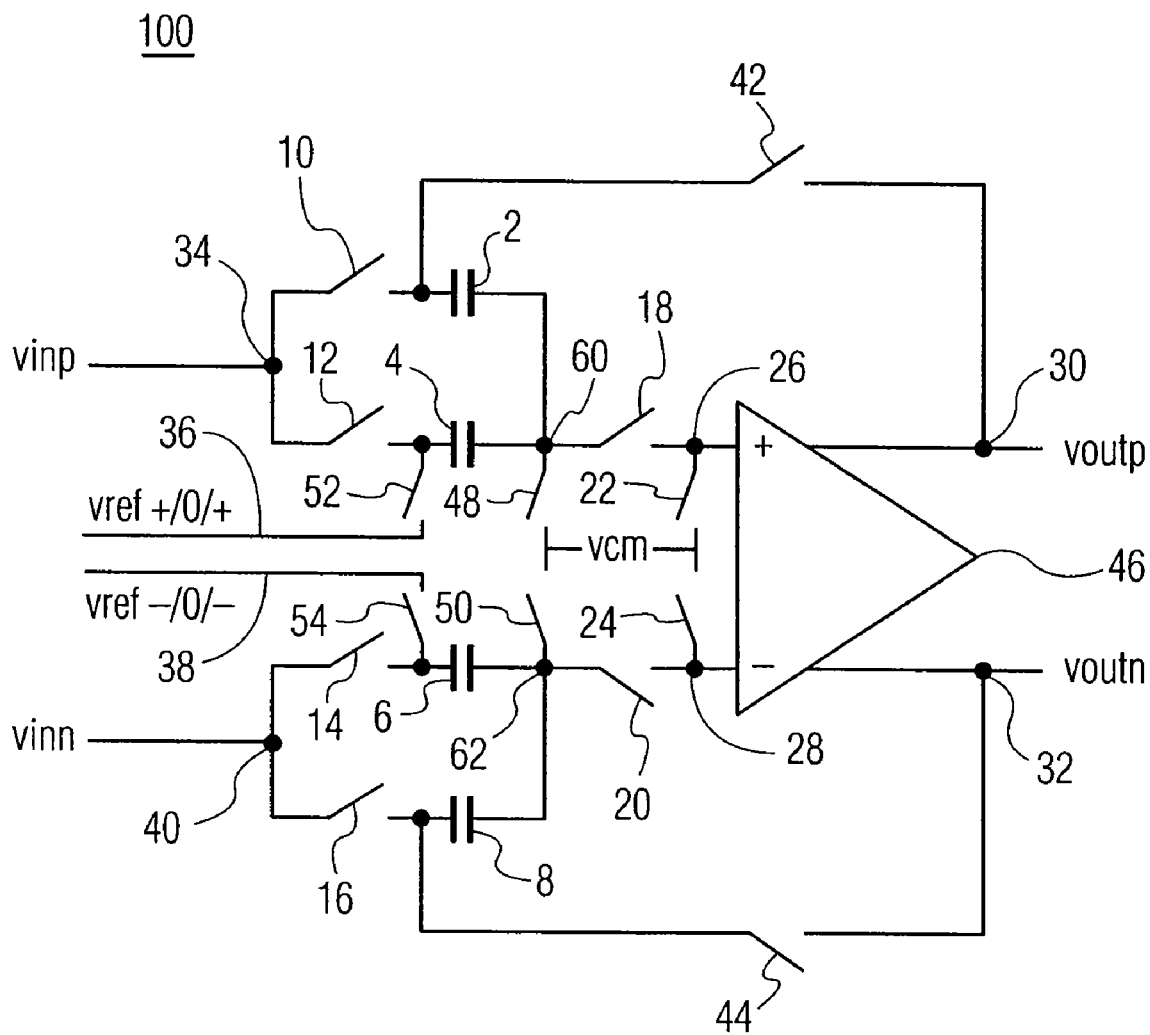
FIG. 6 is a circuit diagram of a switched capacitor amplifier according to an embodiment of the invention.

Switched capacitor amplifier 100 according to an example embodiment of the present invention is shown in FIG. 6. As shown, switched capacitor amplifier 100 may include first and second input nodes 34 and 40 for receiving first and second input signals vinp and vinn of a differential input signal, respectively, and may include first and second reference voltage input nodes 36 and 38 for receiving first and second reference voltages vref+ and vref−, of a differential reference voltage, respectively. Switched capacitor amplifier 100 may also include amplifier 46, which may include first and second amplifier input nodes 26 and 28, for receiving and amplifying the sampled first and second signals, and first and second output nodes 30 and 32 for providing a differential output signal. Amplifier 46 may be any suitable differential amplifier, such as, for example, a differential operational amplifier. Switched capacitor amplifier 100 may also include sampling capacitors 4 and 6 and sampling/feedback capacitors 2 and 8; sampling switches 10, 12, 14 and 16 coupled to top plates of respective sampling capacitors 2, 4, 6 and 8; first and second crowbar switches 52 and 54; feedback switches 42 and 44 in respective feedback lines; decoupling switches 18 and 20 coupled between respective bottom plates of sampling capacitors 2/4 and 6/8 and input nodes 26 and 28; reference voltage line vcm for providing a reference voltage which may be a common mode voltage for the circuit; bottom plate switches 48 and 50 coupled between respective bottom plates of sampling capacitors 2/4 and 6/8; and vcm and reset switches 22 and 24 coupled between the input nodes 26 and 28 and vcm. The example switched capacitor amplifier 100 may be included in the example 1.5 bit per stage pipelined ADC shown in FIG. 5.

While in the above example the sampling capacitors are described as having specific top and bottom plates, this is not intended to limit the scope of the embodiment. Instead, either of the plates of each capacitor may be top plates, bottom plates, first ends or second ends.

Sampling switches 10, 12, 14 and 16, crowbar switches 52 and 54, feedback switches 42 and 44, decoupling switches 18 and 20 and bottom plate switches 48 and 50 may be any suitable switches, such as, for example, MOS transistors or CMOS transfer gates. After current passes through such a switch in a conducting state and the switch is subsequently switched from conducting to not conducting, some amount of charge remaining in the transfer gate when it is turned off may be injected to surrounding components. The amount of charge injected when the switch is switched from conducting to not conducting is proportional to the amount of current passing through the switch immediately before it is switched.

Switched capacitor amplifier 100 may operate in two different phases, which may perform two different functions. The first phase may be a sampling phase. In the sampling phase, the differential input signal may be sampled onto sampling capacitors 2, 4, 6 and 8. The second phase may be an amplifying phase. In the amplifying phase, the capacitors 2 and 8 may be switched by the feedback switches 42 and 44 to become feedback capacitors and the sampled differential input signal may be amplified to a desired gain. If example switched capacitor amplifier 100 were operated in, for example, a 1.5 bit per stage pipelined ADC, the gain for the first stage may be 1 and the gain for the remaining stages may be two and the amplified differential output signal may be output to the next sequential stage in the pipeline. To achieve a gain of two, the capacitance of the sampling capacitors 4 and 6 and the sampling/feedback capacitors 2 and 8 may be substantially equal.

Figure 1:
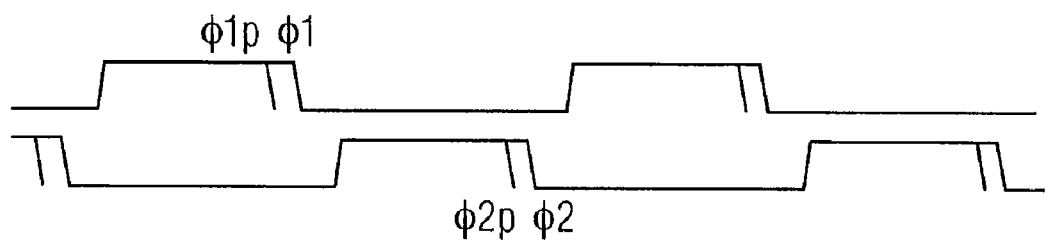
FIG. 1 is a timing diagram for operating a switched capacitor amplifier according to an embodiment of the present invention.

FIG. 1 is a timing diagram showing overlapping clock signal phases φ1p and φ1 and φ2p and φ2, which define the sampling and amplifying phases. Here, at the leading edge of φ1 and φ1p, the sampling phase may begin. Similarly, at the leading edge of φ2 and φ2p, the amplifying phase may begin. This may not, however, always be true. For example, if switched capacitor amplifier 100 were operated in, for example, a 1.5 bit per stage pipelined ADC, only odd stages, for example, may operate as described above. In this example, even stages may operate such that at the leading edge of φ1 and φ1p, the amplifying phase may begin, and at the leading edge of φ2 and φ2p, the sampling phase may begin. Alternatively, the opposite may be true, such that even stages may operate such that at the leading edge of φ1 and φ1p, the sampling phase may begin and at the leading edge of φ2 and φ2p, the amplifying phase may begin. In this alternative construction, odd stages may operate such that at the leading edge of φ1 and φ1p, the amplifying phase may begin and at the leading edge of φ2 and φ2p, the sampling phase may begin. In this way, each stage in the example 1.5 bit per stage pipelined ADC may generate successive bits concurrently, resulting in faster analog to digital conversion of a bit string. During the non-overlap period between the trailing edge of φ1 and the leading edge of φ2 and φ2p, amplifier 46 may be in an open loop configuration.

Operation of example switched capacitor amplifier 100 will now be described with reference to FIGS. 2(*a*)-(*d*), 3(*a*)-(*d*) and 5.

During a first portion of the sampling phase occurring at the leading edge of φ1 and φ1p, sampling switches 10, 12, 14 and 16 and bottom plate switches 48 and 50 may be closed. Closing the bottom plate switches may apply the common mode voltage, vcm, to the bottom plates of sampling capacitors 2, 4, 6 and 8 and closing the sampling switches at the same time may sample first input signal vinp onto sampling capacitors 2 and 4 and second input signal vinn onto sampling capacitors 6 and 8. At the same time, decoupling switches 18 and 20 may be opened and reset switches 22 and 24 may be closed. This arrangement is illustrated in FIG. 2(*a*).

Opening decoupling switches 18 and 20 may electrically disconnect amplifier input nodes 26 and 28 from the bottom plates of sampling capacitors 2, 4, 6 and 8. Further, closing reset switches 22 and 24 may apply vcm to amplifier inputs 26 and 28 to reset amplifier input nodes 26 and 28.

The differential output from amplifier 46 may be zero volts between the leading edge of φ1 and φ1p and the trailing edge of φ1p because no charge may flow to amplifier 46 during this period. This result is shown in FIG. 3(*a*).

During a second portion of the sampling phase occurring at the trailing edge of φ1p, bottom plate switches 48 and 50 may be opened first to electrically disconnect vcm from bottom plate nodes 60 and 62. This step may be referred to as bottom plate sampling. This arrangement is shown in FIG. 2(*b*). Under ideal conditions, when bottom plate switches 48 and 50 are opened, charge injection from bottom plate switches 48 and 50 may be stored in parasitic capacitances at respective bottom plate nodes 60 and 62 and respective amplifier input nodes 26 and 28. The charge injection may, however, be equal at amplifier input nodes 26 and 28 because the input (vcm) to bottom plate nodes 60 and 62 was the same. Further, under ideal conditions, when sampling switches 10, 12, 14 and 16 are subsequently opened, as described below, charge injection from sampling switches 10, 12, 14 and 16 may not be stored in respective sampling capacitors 2 and 4 and 6 and 8 because bottom plate nodes 60 and 62 may be floating.

In reality, however, charge injection from sampling switches 10, 12, 14 and 16 may be stored in sampling capacitors 2, 4, 6 and 8 because there may be a relatively large parasitic capacitance at bottom plate nodes 60 and 62 and, accordingly, those nodes may not be floating. By way of example, assume bottom plate switch 48 is connected to ground. If a parasitic capacitance connected to one of the bottom plate nodes is considered, when sampling switch 10 is turned off, sampling capacitor 2 may store an injected charge according to the following equation (1):

$$Q\_injected = V in(Csample \times Cp)/(Csample + Cp), \quad (1)$$

where Q_injected may be the charge injected from the associated sampling switches, Vin may be an input voltage, Csample may be the capacitance on the associated sampling capacitor and Cp may be the parasitic capacitance connected to the bottom plate node. If the node is floating (Cp=0), then Q_inject will also equal zero. If, however, the node is connected to ground such that Cp is large, Q_injected=Csample×Vin.

In normal operation of a switched capacitor amplifier, without use of decoupling switches 18 and 20, Cp seen by sampling capacitors 2, 4, 6 and 8 may be relatively large. Without decoupling switches 18 and 20, then, sampling capacitors 2, 4, 6 and 8 may store at least some charge injected from opening sampling switches 10, 12, 14 and 16.

Figure 2A:
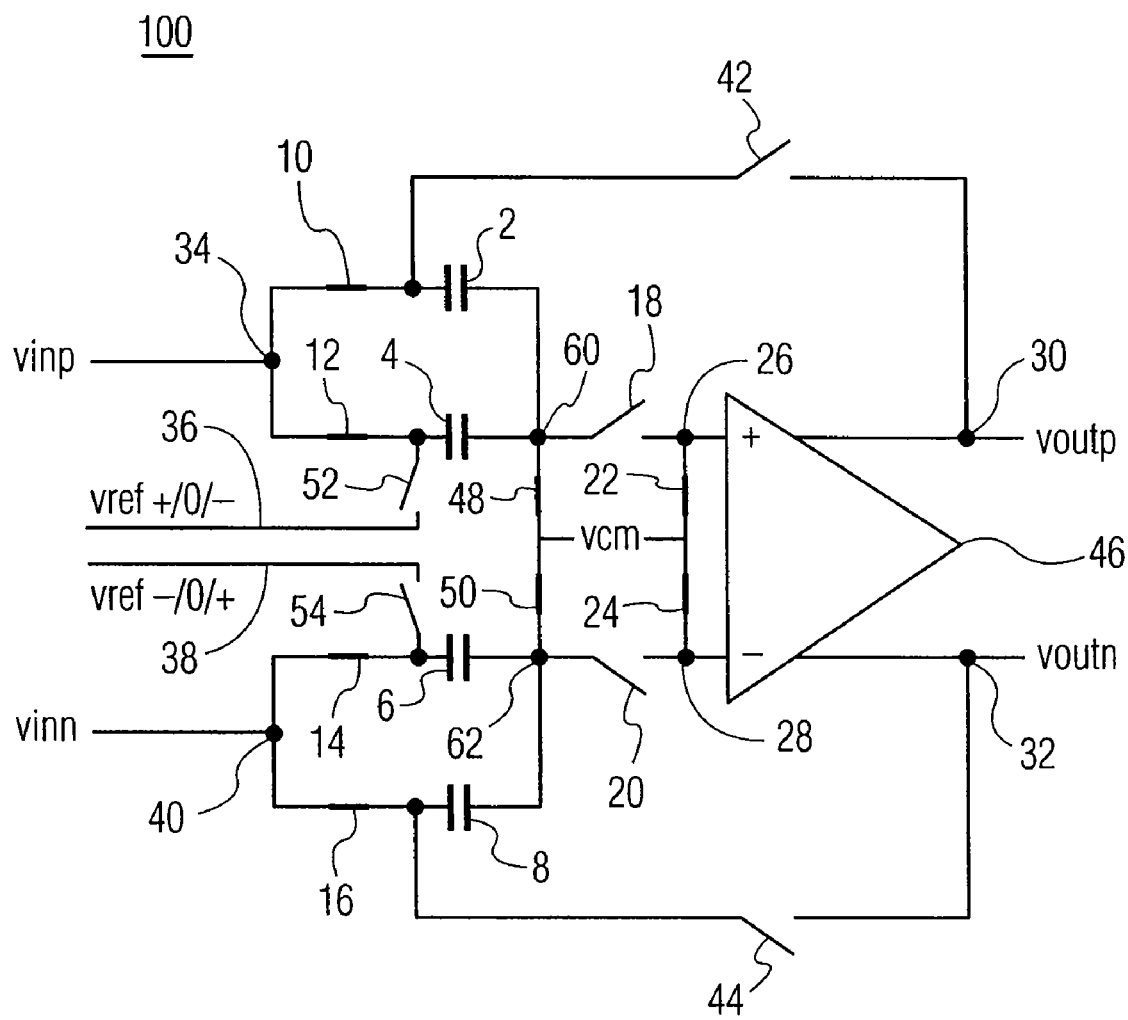
FIG. 2(a) is a circuit diagram of a switched capacitor amplifier at a first time during the sampling phase according to an embodiment of the present invention.
Figure 2B:
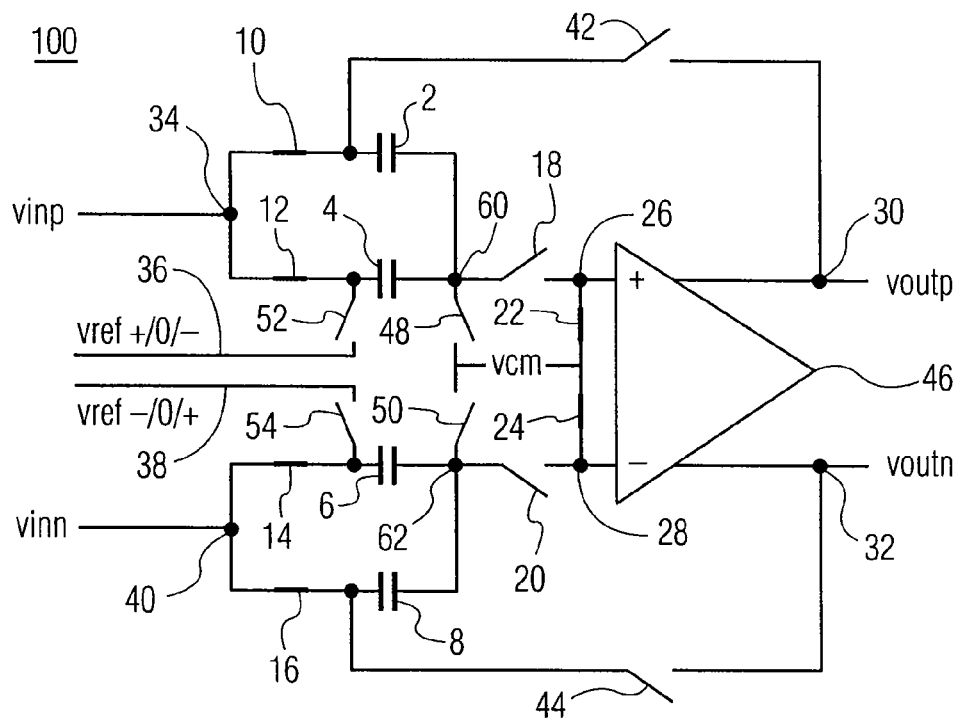
FIG. 2(b) is a circuit diagram of the switched capacitor amplifier of FIG. 2(a) at a second time during the sampling phase.
Figure 2C:
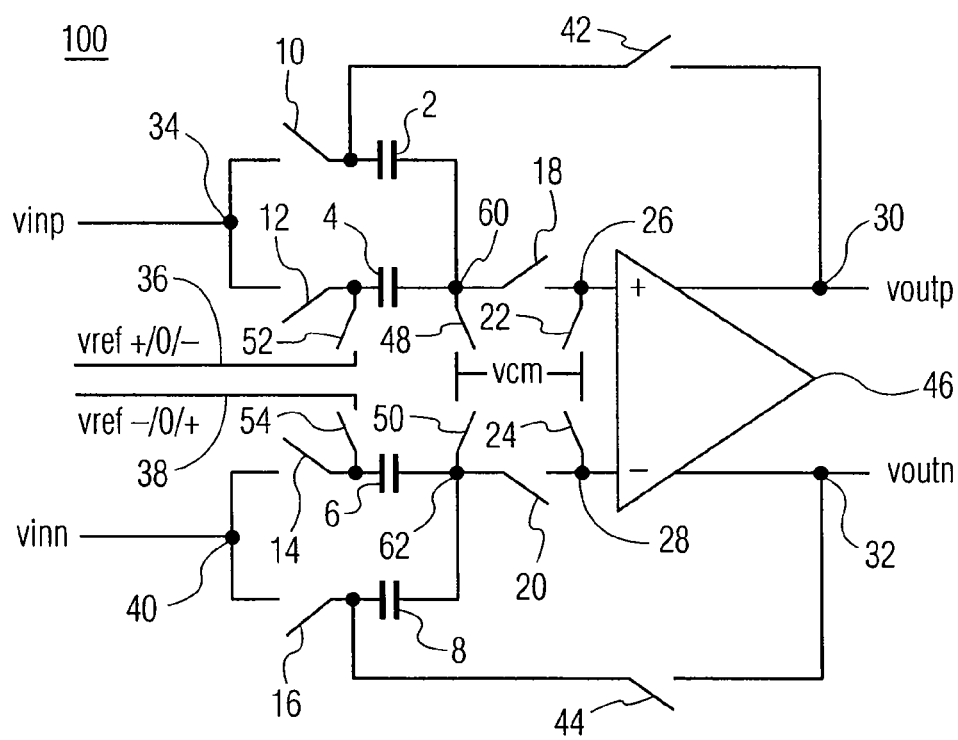
FIG. 2(c) is a circuit diagram of the switched capacitor amplifier of FIGS. 2(a) and (b) during a third time during the sampling phase.

Using the embodiment of FIGS. 2(a) through 2(d), any charge injected from bottom plate switches 48 and 50 to amplifier 46 may cancel out due to the completely differential architecture of the example switched capacitor amplifier 100. That is, when the bottom plate switches are opened, each one may inject the same amount of charge so that the differential output due to charge injection from the bottom plate switches may be zero. Thus, the differential output of amplifier 46 may be zero volts during the period between the trailing edges of φ1p and φ1, as shown in FIG. 3(b).

Then, during a third portion of the sampling phase occurring at the trailing edge of φ1, sampling switches 10, 12, 14 and 16 and reset switches 22 and 24 may be opened. Opening the sampling switches may electrically disconnect the top plates of the sampling capacitors from the circuit input nodes. Opening the reset switches may electrically disconnect the amplifier input nodes from vcm. Decoupling switches 18 and 20 may remain open at this time, electrically disconnecting the amplifier from the bottom plates of the sampling capacitors. This arrangement is shown in FIG. 2(c).

Because the amplifier may be electrically disconnected from the bottom plates of the sampling capacitors, Cp seen by sampling capacitors 2, 4, 6 and 8 at bottom plate nodes 60 and 62 may be reduced. Accordingly, bottom plate sampling may operate according to or close to the ideal situation described above. In this way, decoupling switches 18 and 20 may prevent or substantially decrease injected charge, from sampling switches 10, 12, 14 and 16, from being stored in sampling capacitors 2, 4, 6 and 8 and ultimately transferred to amplifier input nodes 26 and 28.

Preventing or substantially reducing charge injection from sampling switches 10, 12, 14 and 16 may be desirable because this charge injection may not be equal, as may be the case for charge injection from bottom plate switches 48 and 50. This is because vinp and vinn, which were applied to sampling switches 10, 12, 14 and 16, may be different, whereas vcm applied to bottom plate switches 18 and 20 was the same.

As with the bottom plate switches, charge injected by turning off the reset switches 22 and 24 may cancel out due to the completely differential architecture of the example switched capacitor amplifier 100. That is, when the reset switches are opened, each one may inject the same amount of charge so that differential input due to charge injection from the bottom plate switches may be zero. As with the bottom plate switches, this may be because a single potential, vcm, is applied to reset switches 22 and 24.

Figure 3A:
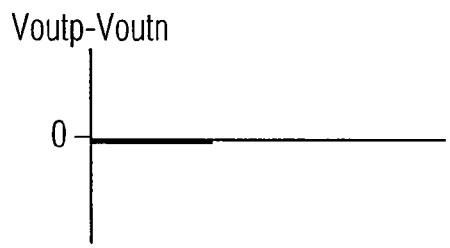
FIG. 3(a) is a graph showing a differential output of a differential amplifier of the switched capacitor amplifier during the phase shown in FIG. 2(a).
Figure 3B:
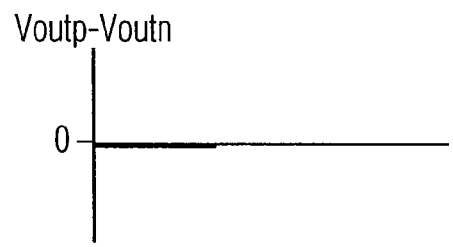
FIG. 3(b) is a graph showing a differential output of the differential amplifier of the switched capacitor amplifier during the phase shown in FIG. 2(b).
Figure 3C:
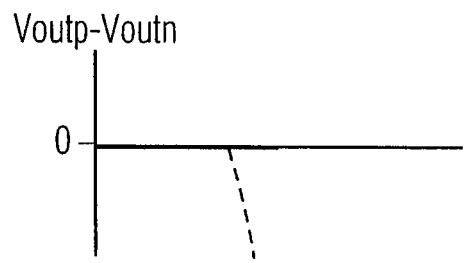
FIG. 3(c) is a graph showing a comparison between the differential output of the differential amplifier of the switched capacitor amplifier during the phase shown in FIG. 2(c) and the differential output of a conventional switched capacitor amplifier.

As shown by the solid line in FIG. 3(c), the differential output of amplifier 46 may remain at zero volts between the trailing edge of φ1 and the leading edge of φ2. This is because decoupling switches 18 and 20 may be open when sampling switches 10, 12, 14 and 16 are opened and, accordingly, charge injection to amplifier input nodes 26 and 28 may be differential zero.

The dashed line in FIG. 3(c) represents a differential output of amplifier 46 in the hypothetical situation where decoupling switches 18 and 20 are not included in switched capacitor amplifier 100. Here, the differential output of amplifier 46, voutp−voutn, may become negative quickly. This is because amplifier 46 may be in an open loop configuration during the non-overlap period when the injected charge is applied to the input terminals of the amplifier.

Figure 2D:
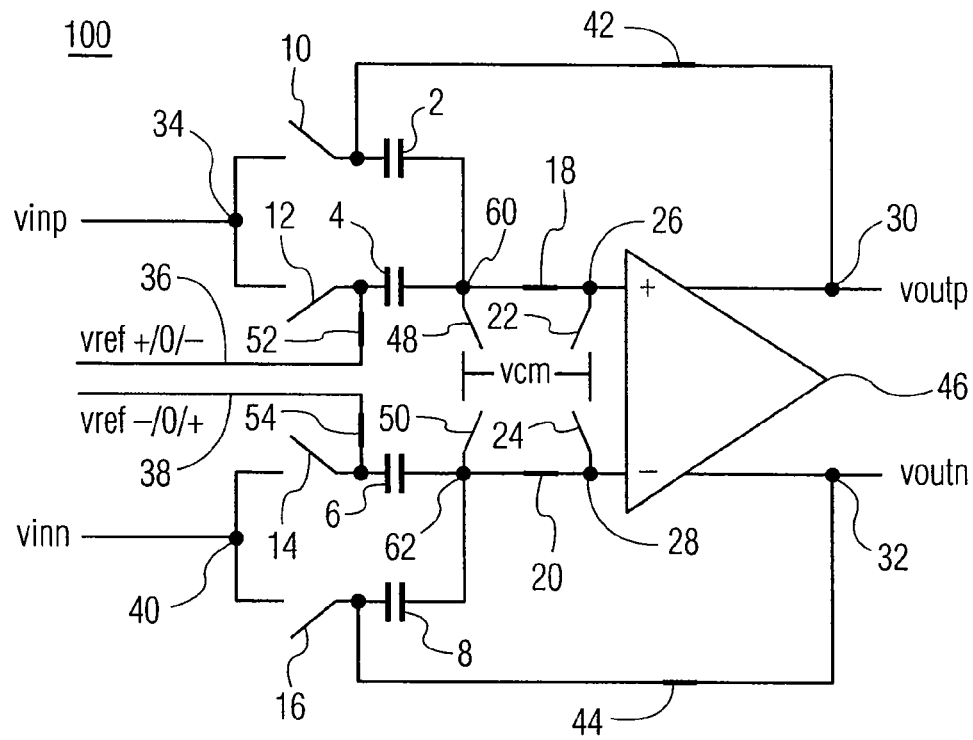
FIG. 2(d) is a circuit diagram of the switched capacitor amplifier of FIGS. 2(a)-(c) during the amplifying phase.

As shown in FIG. 2(d), during the amplifying phase beginning at the leading edge of φ2 and φ2p in FIG. 1, crowbar switches 52 and 54 and feed back switches 42 and 44 may be closed to achieve, for example, an amplifier gain of 2vin/vref.

Such gain of 2 may be desirable, for example, in second through seventh stages of the example 1.5 bit per stage pipelined ADC of FIG. 6.

Figure 3D:
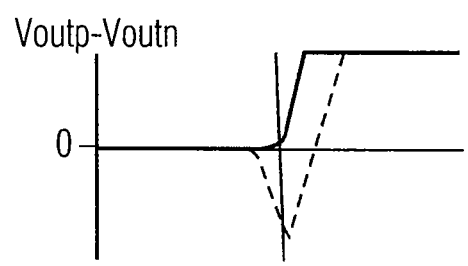
FIG. 3(d) is a graph showing a comparison between the differential output of the differential amplifier of the switched capacitor amplifier during the phase shown in FIG. 2(d) and the differential output of a conventional switched capacitor amplifier.

As shown by the solid line in FIG. 3(d), the starting point for settling of amplifier 46 is differential zero. As shown by the dashed line in FIG. 3(d), the starting point for settling of amplifier 46 in the hypothetical situation in which decoupling switches 18 and 20 are not included in the switched capacitor amplifier is not differential zero. Instead, it is differential negative, due to the unequal charge injection from sampling switches 10, 12, 14 and 16 described above. As shown, use of decoupling switches 18 and 20 as described above may result in shorter settling time for amplifier 46, resulting in reduced power consumption for switched capacitor amplifier 100.

Figure 4:
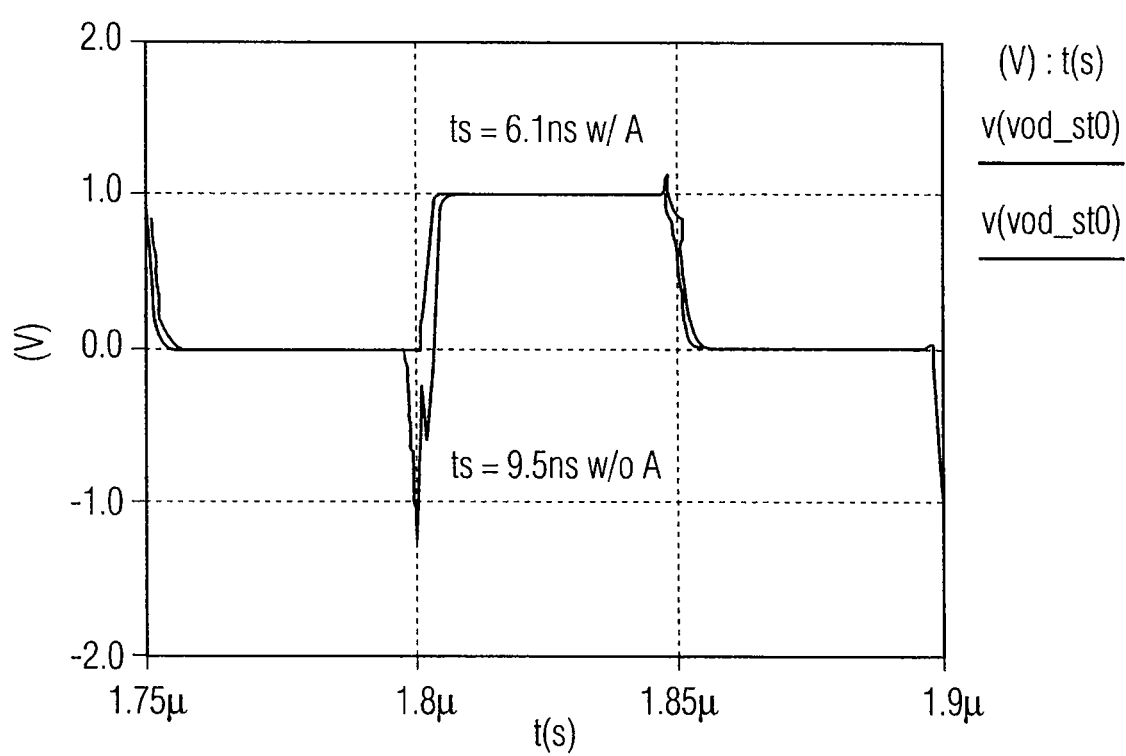
FIG. 4 is a diagram and graph showing a computer simulation and the differential amplifier output results of the computer simulation of the switched capacitor amplifier of FIGS. 2(a)-(d).

FIG. 4 shows the results of computer simulations of example switched capacitor amplifier 100. As shown, without decoupling and reset switches, the settling time for the amplifier is 9.5 ns. With decoupling and reset switches, however, the settling time for the amplifier is 6.1 ns.

Accordingly, the example switched capacitor amplifier of the present invention may reduce settling time for the amplifier, thus reducing power consumption by the switched capacitor amplifier. If the example switched capacitor amplifier is used in, for example, a pipelined ADC, the power savings may be multiplied for each example switched capacitor amplifier located at each stage. Accordingly, the power savings due to the faster settling time may be substantial.

While example embodiments of the invention have been shown and described herein, it will be understood that such embodiments are provided by way of example only. Numerous variations, changes and substitutions will occur to those skilled in the art without departing from the invention.

What is claimed:

1. A circuit comprising:
at least one sampling capacitor having a first end and a second end, each sampling capacitor configured to sample at least one respective signal during a sampling phase via the second end;
an differential amplifier, having at least one input node and at least one output node, the amplifier being configured to receive at least one signal from the first end of the at least one sampling capacitor via the at least one differential input node;
at least one decoupling switch configured to isolate the at least one first end of the at least one sampling capacitor from the amplifier during the sampling phase and to connect the at least one first end of the at least one sampling capacitor to the at least one input node of the amplifier during an amplifying phase following the sampling phase; and
at least one reset switch configured to connect the at least one differential amplifier input node to a reference voltage when the sampling phase starts, to reset the at least one amplifier input node, and to disconnect the at least one amplifier input node from the reference voltage when the sampling phase ends wherein the reset switch is configured to cancel charge injected into the differential input when the reset switch is opened.

2. The circuit of claim 1, further comprising at least one first end switch configured to connect at least one respective first end of the at least one capacitor to the reference voltage, when the sampling phase begins, to store a sample of the at least one respective signal to the at least one sampling capacitor and to disconnect the at least one respective first end from the reference voltage when the sampling phase ends.

3. The circuit of claim 2, further comprising:
at least one sampling switch configured to connect the second end of the at least one sampling capacitor to the at least one respective input signal when the sampling phase begins and to disconnect the second end of the at least one sampling capacitor from the at least one respective input signal when the sampling phase ends; and
at least one reference switch configured to connect the second end of the at least one sampling capacitor to at least one respective reference voltage during the amplifying phase.

4. The circuit of claim 3, wherein the first end switch is configured to disconnect the first end of the capacitor from the reference voltage before the sampling switch disconnects the second end of the at least one sampling capacitor from the at least one respective input signal at the end of the sampling period.

5. The circuit of claim 1, further comprising:
at least one feedback capacitor having a first end and a second end, the first end of the at least one feedback capacitor being connected to the first end of the sampling capacitor;
a further sampling switch, coupled between the second end of the feedback capacitor and the input signal, for connecting the feedback capacitor to the input signal when the sampling phase begins and for disconnecting the feedback capacitor from the input signal when the sampling phase ends; and
at least one feedback switch coupled between the second end of the at least one feedback capacitor and the at least one output node of the differential amplifier, the feedback switch being configured to connect the second end of the feedback capacitor to the output node of the differential amplifier during the amplifying phase and to disconnect the second end of the feedback capacitor from the output node of the amplifier during the sampling phase.

6. The circuit of claim 5, wherein the at least one sampling capacitor and the at least one feedback capacitor are selected to provide an amplifier gain of two.

7. A circuit comprising:
a first sampling capacitor having a first bottom plate and a first top plate and a second sampling capacitor having a second bottom plate and a second top plate;
first and second circuit input nodes for receiving first and second differential signals, respectively;
a first sampling switch coupled between the first circuit input node and the first top plate and configured to selectively apply the first differential signal to the first top plate and a second sampling switch coupled between the second circuit input node and the second top plate configured to selectively apply the second differential signal to the second top plate;
a differential amplifier including first and second amplifier input nodes and first and second amplifier output nodes configured to receive and differentially amplify first and second input signals applied to the first and second amplifier input nodes, respectively, to produce first and second differential output signals at the first and second amplifier output nodes, respectively;
a first decoupling switch coupled between the first bottom plate and the first amplifier input node and a second decoupling switch coupled between the second bottom plate and the second amplifier input node;
a common mode voltage line;
first and second bottom plate switches, configured to selectively connect the common mode voltage line to the first bottom plate and the second bottom plate whereby, when the first signal and the second signal are applied to the respective first and second top plates and the common mode voltage is applied to the respective first and second bottom plates, the first and second sampling capacitors sample the respective first and second signals; and
a first reset switch coupled between the common mode voltage line and the first amplifier input node and a second reset switch coupled between the common mode voltage line and the second amplifier input node, whereby the first and second reset switches are configured to apply the common mode voltage to the first and second amplifier input nodes when the first and second sampling capacitors sample the respective first and second signals.

8. The circuit of claim 7, wherein:
the first and second decoupling switches are configured to disconnect the first and second amplifier input nodes from the respective first and second bottom plates when the first and second sampling capacitors sample the respective first and second signals and to connect the first and second amplifier input nodes to the respective first and second bottom plates to transfer the sampled first and second signals to the amplifier,
the circuit further comprises a first reference switch and a second reference switch configured to apply a first reference voltage and a second reference voltage to the first top plate and the second top plate, respectively,
the first and second bottom plate switches are configured to disconnect the respective first and second bottom plates from the common mode voltage before the first and second decoupling switches connect the first and second amplifier input nodes to the respective first and second bottom plates, and
the first and second reference switches are configured to apply the first and second reference voltage to the first and second top plates, respectively, when the first and second decoupling switches connect the first and second amplifier input nodes to the respective first and second bottom plates.

9. The circuit of claim 8, wherein the first and second bottom plate switches are configured to disconnect the respective first and second bottom plates from the common mode voltage before the first and second sampling switches disconnect the respective first and second top plates from the respective first and second differential signals.

10. The circuit of claim 7, further comprising:
first and second feedback capacitors, each having a first end and a second end, the first end of the first feedback capacitor being connected to the bottom plate of the first sampling capacitor and the first end of the second feedback capacitor being connected to the bottom plate of the second sampling capacitor;
first and second further sampling switches, the first further sampling switch being coupled between the second end of the first feedback capacitor and the first circuit input node for selectively applying the first differential input signal to the second end of the first feedback capacitor and the second further sampling switch being coupled between the second end of the second feedback capacitor and the second circuit input node for selectively applying the second differential input signal to the second end of the second feedback capacitor; and
first and second feedback switches, the first feedback switch being configured to selectively couple the first amplifier output node to the second end of the first feedback capacitor and the second feedback switch being configured to selectively couple the second amplifier output node to the second end of the second feedback capacitor.

11. The circuit of claim 10, wherein the first and second sampling capacitors and the first and second feedback capacitors have substantially equal capacitances.

12. The circuit of claim 11,
wherein the first and second decoupling switches, the first and second reset switches, the first and second sampling switches and the first and second feedback switches include metal-oxide semiconductor (MOS) switches.

13. The circuit of claim 12, wherein the first and second decoupling switches, the first and second reset switches, the first and second sampling switches and the first and second feedback switches are complementary MOS (CMOS) transfer gates.

14. A method of operating a switched capacitor differential amplifier circuit, comprising:
disconnecting a first end of a first sampling capacitor from a first input node of an amplifier and disconnecting a first end of a second sampling capacitor from a second input node of the amplifier;
connecting the first ends of the first and second capacitors to a reference voltage;
when the first ends of the first and second capacitors are disconnected from the respective first and input nodes of the amplifier, coupling the respective second ends of the first and second capacitors to receive a first input signal and a second input signal, respectively; and
while the first and second input signals are connected to the first and second sampling capacitors, respectively, applying the reference voltage to the first and second input nodes of the differential amplifier and disconnecting the reference voltage from the first and second input nodes of the differential amplifier by opening a reset switch, wherein the reset switch is configured to cancel charge injected into the first and second input nodes of the differential amplifier when the reset switch is opened.

15. The method of claim 14, further comprising:
disconnecting respectively the second ends of the first and second capacitors from the first and second input signals and disconnecting the first and second input nodes of the differential amplifier from the reference voltage, connecting the first end of the first capacitor to the first input node, connecting the first end of the second capacitor to the second input node, connecting the second end of the first capacitor and the second end of the second capacitor to respective first and second reference voltages and transferring the first and second signals to the amplifier.

16. The method of claim 15, further comprising the step of:
before connecting the first end of first capacitor to the first input node of the amplifier and connecting the first end of the second capacitor to the second input node of the amplifier and after disconnecting the first ends of the first and second capacitors from the reference voltage, disconnecting the second ends of the first and second capacitors, respectively, from the first and second circuit input nodes and connecting the second end to the first and second reference voltages, respectively.

17. The method of claim 16, further comprising the step of disconnecting the first ends of the first and second capacitors from the reference voltage before disconnecting the second ends of the respective first and second capacitors from the respective first and second circuit input nodes.

18. The method of claim 16, wherein each of the first and second sampling capacitors includes a sampling capacitor coupled in parallel with a sampling/feedback capacitor and the method further comprises the step of, after disconnecting the second ends of the first and second sampling/feedback capacitors from the respective first and second input nodes, connecting the respective first ends of the first and second sampling/feedback capacitors to respective first and second differential output terminals of the amplifier.

19. The method of operating a circuit of claim 15, further comprising the step of,
before connecting the first end of first capacitor to the first input node and connecting the first end of second capacitor to the second input node and after disconnecting the first ends of the first and second capacitors from the reference voltage, disconnecting the first and second input nodes of the amplifier from the reference voltage.

20. A pipelined analog to digital converter comprising:
a plurality of cascade connected analog to digital converting stages, each stage configured to convert a portion of an analog signal into at least one digital bit,
each stage comprising at least one switched capacitor amplifier, the at least one switched capacitor amplifier comprising:
at least one sampling capacitor, configured to sample an input signal during a sampling phase;
an differential amplifier configured to receive the input signal from the at least one sampling capacitor via at least one differential amplifier input node;
at least one decoupling switch configured to isolate the at least one sampling capacitor from the amplifier during the sampling phase and to connect the at least one sampling capacitor to the amplifier during an amplifying phase; and
at least one reset switch configured to connect the at least one differential amplifier input node to a reference voltage during the sampling phase to reset the at least one differential amplifier input node wherein the reset switch is configured to cancel charge injected into the differential input when the reset switch is opened.

21. A pipelined analog to digital converter according to claim 20, wherein:
the at least one sampling capacitor of the at least one switched capacitor differential amplifier includes a sampling capacitor and a sampling/feedback capacitor which are coupled in parallel during the sampling phase; and
the sampling/feedback capacitor is coupled between the differential amplifier input node and an amplifier output node of the amplifier during the amplifying phase.

22. The pipelined analog to digital converter of claim 20, wherein:
each stage is configured to receive a clock signal comprising first and second clock phases such that the sampling phase begins at an instant corresponding to a leading edge of the first clock phase and the amplifying phase begins at an instant corresponding to a leading edge of the second clock phase,
at the leading edge of the first clock phase, the at least one sampling capacitor is configured to begin sampling, the at least one decoupling switch is configured to isolate the at least one sampling capacitor from the amplifier and the at least one reset switch is configured to connect the at least one differential amplifier input node to a reference voltage, and
at the leading edge of the second clock phase, the at least one decoupling switch is configured to connect the at least one sampling capacitor to the differential amplifier and at least one reference switch is configured to connect the at least one sampling capacitor to at least one respective reference voltage.

23. The pipelined analog to digital converter of claim 22, further comprising at least one sampling switch configured to selectively connect the at least one sampling capacitor to the input signal during the sampling phase, wherein the at least one sampling switch is configured to disconnect the at least one sampling capacitor from the input signal after the at least one reset switch disconnects the at least one sampling capacitor from the reference voltage.

* * * * *

UNITED STATES PATENT AND TRADEMARK OFFICE
CERTIFICATE OF CORRECTION

| | | |
|---|---|---|
| PATENT NO. | : 7,633,423 B2 | Page 1 of 1 |
| APPLICATION NO. | : 11/934195 | |
| DATED | : December 15, 2009 | |
| INVENTOR(S) | : Taehee Cho | |

It is certified that error appears in the above-identified patent and that said Letters Patent is hereby corrected as shown below:

In column 6, line 41, in Claim 1, delete "an" and insert -- a --, therefor.

In column 6, line 41, in Claim 1, delete "one input" and insert -- one differential input --, therefor.

In column 7, line 37, in Claim 5, delete "amplifier" and insert -- differential amplifier --, therefor.

In column 9, line 31, in Claim 14, delete "respectively; and" and insert -- respectively; --, therefor.

In column 9, line 61, in Claim 16, delete "end" and insert -- ends --, therefor.

In column 10, line 23, in Claim 20, delete "amplifier," and insert -- differential amplifier, --, therefor.

In column 10, line 27, in Claim 20, delete "an" and insert -- a --, therefor.

In column 10, line 50, in Claim 21, delete "amplifier" and insert -- differential amplifier --, therefor.

In column 10, line 62, in Claim 22, delete "amplifier" and insert -- differential amplifier --, therefor.

Signed and Sealed this

Twenty-third Day of March, 2010

David J. Kappos
*Director of the United States Patent and Trademark Office*